United States Patent [19]
Kitayoshi

[11] Patent Number: 5,146,224
[45] Date of Patent: Sep. 8, 1992

[54] AC SIGNAL GENERATING APPARATUS FOR VOLTAGE AND CURRENT STANDARD

[75] Inventor: Hitoshi Kitayoshi, Gyoda, Japan

[73] Assignee: Advantest Corporation, Tokyo, Japan

[21] Appl. No.: 629,742

[22] Filed: Dec. 18, 1990

[30] Foreign Application Priority Data

Dec. 20, 1989 [JP] Japan .................................. 1-330479

[51] Int. Cl.[5] ............................................. H03M 1/66
[52] U.S. Cl. ...................................... 341/147; 341/144
[58] Field of Search ................ 341/117, 122, 144, 147

[56] References Cited

U.S. PATENT DOCUMENTS

| | | | |
|---|---|---|---|
| 3,987,280 | 10/1976 | Bauer | 341/144 |
| 4,068,178 | 1/1978 | Tunzi | 341/147 |
| 4,157,538 | 6/1979 | Simon et al. | 341/115 |
| 4,315,219 | 2/1982 | Rocheleau et al. | 328/14 |
| 4,618,851 | 10/1986 | Watanabe | 341/139 |
| 4,975,699 | 12/1990 | Frey | 341/118 |

Primary Examiner—Marc Hoff
Attorney, Agent, or Firm—Staas & Halsey

[57] ABSTRACT

In an AC signal generating apparatus a digital sine wave signal of a set frequency, generated by a digital sine wave signal generating part, is converted by a D/A converter to an analog sine wave signal and is then output. The output sine wave signal is converted by an output detector to a voltage mean value, and the difference between it and a reference value is obtained by a comparator. The difference is negatively fed back, as a reference voltage, to the D/A converter to control its conversion gain so that the difference may approach zero. Thus, a highly accurate sine wave signal is obtained.

4 Claims, 4 Drawing Sheets

AC SIGNAL GENERATING APPARATUS FOR VOLTAGE AND CURRENT STANDARD

BACKGROUND OF THE INVENTION

1. Technical Field

The present invention relates to an AC signal generating apparatus which generates, with a resolving power of about 1 ppm, a constant-voltage or constant-current AC signal of a frequency ranging between 10 and 40 MHz, for instance.

2. Description of the Related Art

FIG. 1 shows a conventional constant-voltage AC signal generating apparatus, in which an AC signal of a set voltage Va is generated by an AC signal source 11 and is supplied to a differential amplifier 12, its output is provided via an output terminal 13 to a load 14 and the voltage of the load 14 is negatively fed back to the differential amplifier 12 via a terminal 15 to ensure the application of the set voltage Va to the load 14.

FIG. 2 shows another prior art example. An AC signal from the AC signal source 11 is applied to an inverting input end of an operational amplifier 17 via a variable resistance element 16, for example, a heat sensitive resistance element such as a thermistor, a photosensitive resistance element such as a CdS, or a magnetic resistance element. The operational amplifier 17 has its non-inverting input end ground and its inverting input end and output end interconnected via a negative feedback resistor 18. The output of the operational amplifier 17 is provided via the output terminal 13 to the load 14, a voltage Vi which is applied to the load 14 is supplied via the terminal 15 to an output detector 19. In the output detector 19 the absolute value $|Vi|$ of the load voltage Vi is obtained and its mean value $|\overline{Vi}|$ is provided to a comparator 21 for comparison with a reference voltage $V_E$. The comparator output is used to control the resistance value of the variable resistance element 16 so that the mean value of the load voltage (amplitude) may be equal to the reference voltage $V_E$.

In the conventional system of FIG. 1, since the input side of the differential amplifier 12 does not go into a virtually-grounded state, distortion is large and varies with a change in the operating point. Furthermore, when the differential amplifier 12 and the load 14 are spaced a long distance apart, there is a possibility that a phase delay of signal in the path from the output terminal 13 of the differential amplifier 12 to its inverting input end increases, providing a positive feedback to cause oscillation of the differential amplifier 12. Hence, this apparatus cannot be used under high frequency conditions.

The apparatus shown in FIG. 2 is of the type that controls the resistance value of the variable resistance element 16. Since the variable resistance element 16 has a nonlinear input voltage-output current characteristic, signal distortion is as large as about −40 dB of the fundamental wave.

SUMMARY OF THE INVENTION

It is therefore an object of the present invention to provide an AC signal generating apparatus which permits the generation of a low-distortion AC signal.

According to the present invention, a digital direct synthesizer is employed which generates a digital sine wave signal of a preset frequency and converts it by a D/A converter to an analog sine wave signal for output, the mean value, effective value or maximum value of the output voltage or current of the digital direct synthesizer is detected by an output detector, the detected output of which is compared with a reference value in a comparator, and the comparator output is negatively fed back to the D/A converter to control its reference voltage so that the detector output and the reference value become equal to each other. With an arrangement which includes a frequency converter connected to the input side of the output detector for converting an AC signal to a low-frequency signal for supply to the output detector, it is possible to generate the sine wave signal up to high frequencies with high degree of accuracy.

DESCRIPTION OF THE PREFERRED EMBODIMENTS

Figure 1:
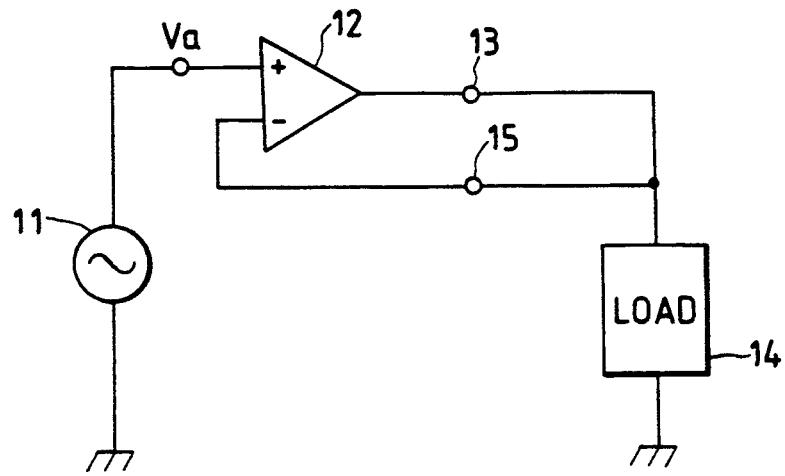
FIG. 1 is a block diagram showing an example of a conventional AC signal generating apparatus.
Figure 2:
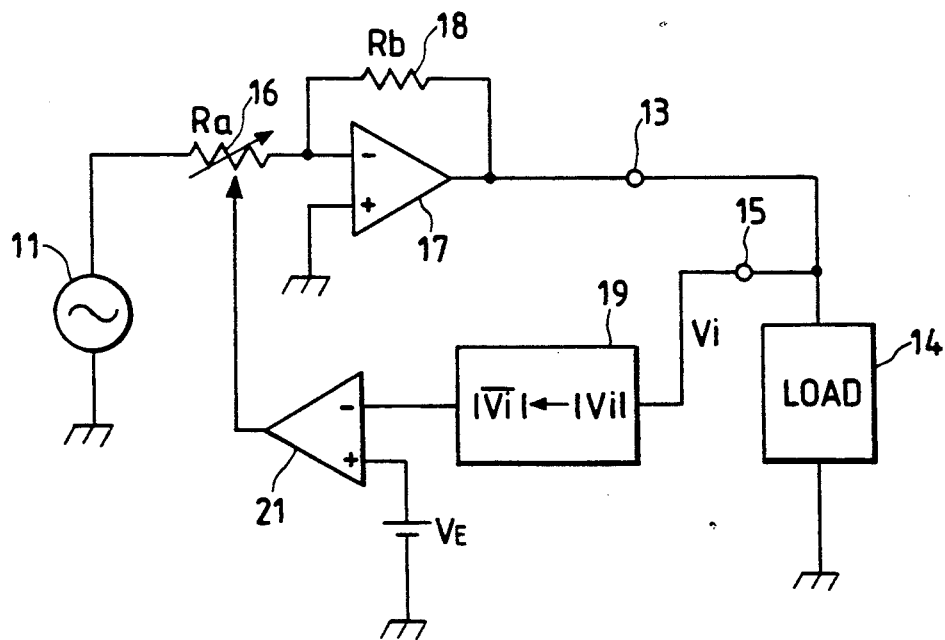
FIG. 2 is a block diagram showing another example of the conventional AC signal generating apparatus.
Figure 3:
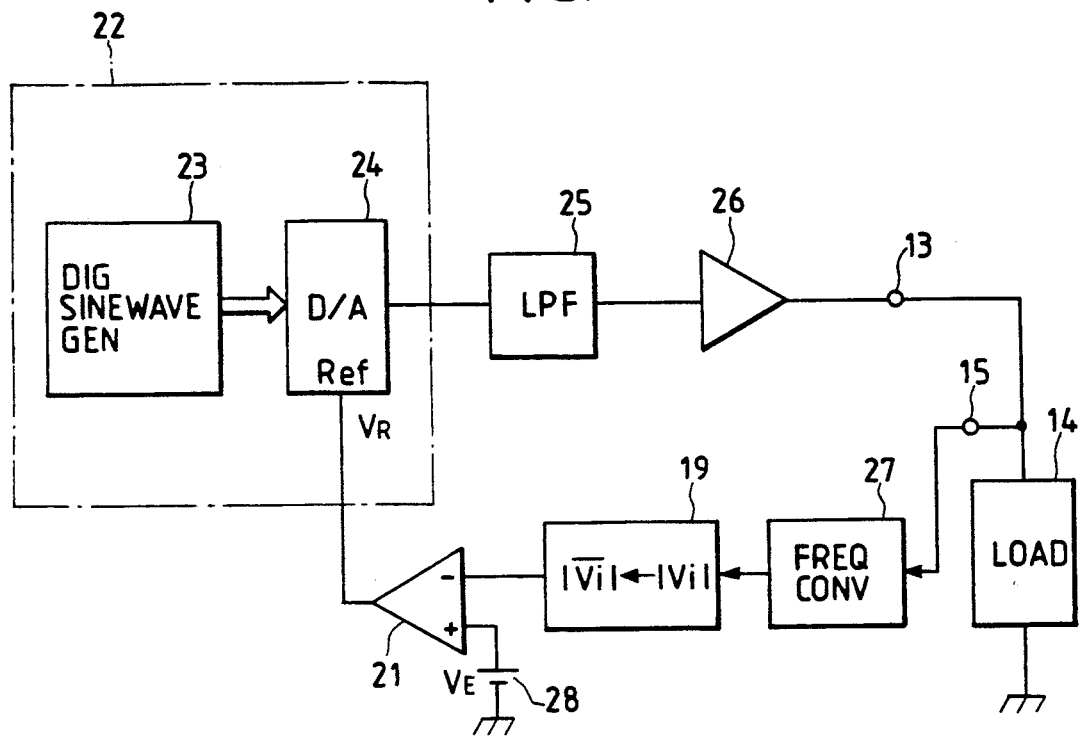
FIG. 3 is a block diagram illustrating an embodiment of the present invention.

FIG. 3 illustrates in block form an embodiment of the present invention, in which a digital direct synthesizer 22 is provided. In the digital direct synthesizer 22 a digital sine wave signal of a preset frequency is produced by a digital sine wave generator 23 and is converted by a D/A converter 24 to an analog sine wave signal. The analog sine wave signal is applied to a low-pass filter 25, wherein it is waveform interpolated or rendered smooth in waveform, and the filter output is amplified by an amplifier 26, thereafter being applied to the load 14 via the output terminal 13. The voltage which is provided to the load 14 is detected at the terminal 15 and is converted by a frequency converter 27 to a low-frequency signal, which the output detector 19, wherein its mean of absolute, effective or maximum value is detected. The output detector 19 is a circuit that creates, for example, an absolute value $|Vi|$ of the input signal $|Vi|$ and obtains therefrom its mean value $|\overline{Vi}|$. The output detector 19 can be formed by operational amplifiers having feedback diodes and integration circuit, for instance. The detected output of the output detector 19 is provided to the comparator 21, wherein it is compared with the reference voltage $V_E$ of a reference source 28. The comparator output is negatively fed back to the D/A converter 24 to control its reference voltage $V_R$ in accordance with the difference between the detected output of the output detector 19 and the reference voltage $V_E$. That is, a negative feedback loop is established in which, through utilization of the fact that the amplitude of the analog sine wave signal output of the D/A converter 24 is in proportion to its reference voltage $V_R$, the output of the comparator 21 is provided as the reference voltage $V_R$ to the D/A converter 24 to control its conversion gain so that the output Of the comparator 21 is reduced to zero. Consequently, the mean value of the load voltage at the terminal 15 becomes equal to the reference voltage $V_E$.

Figure 4:
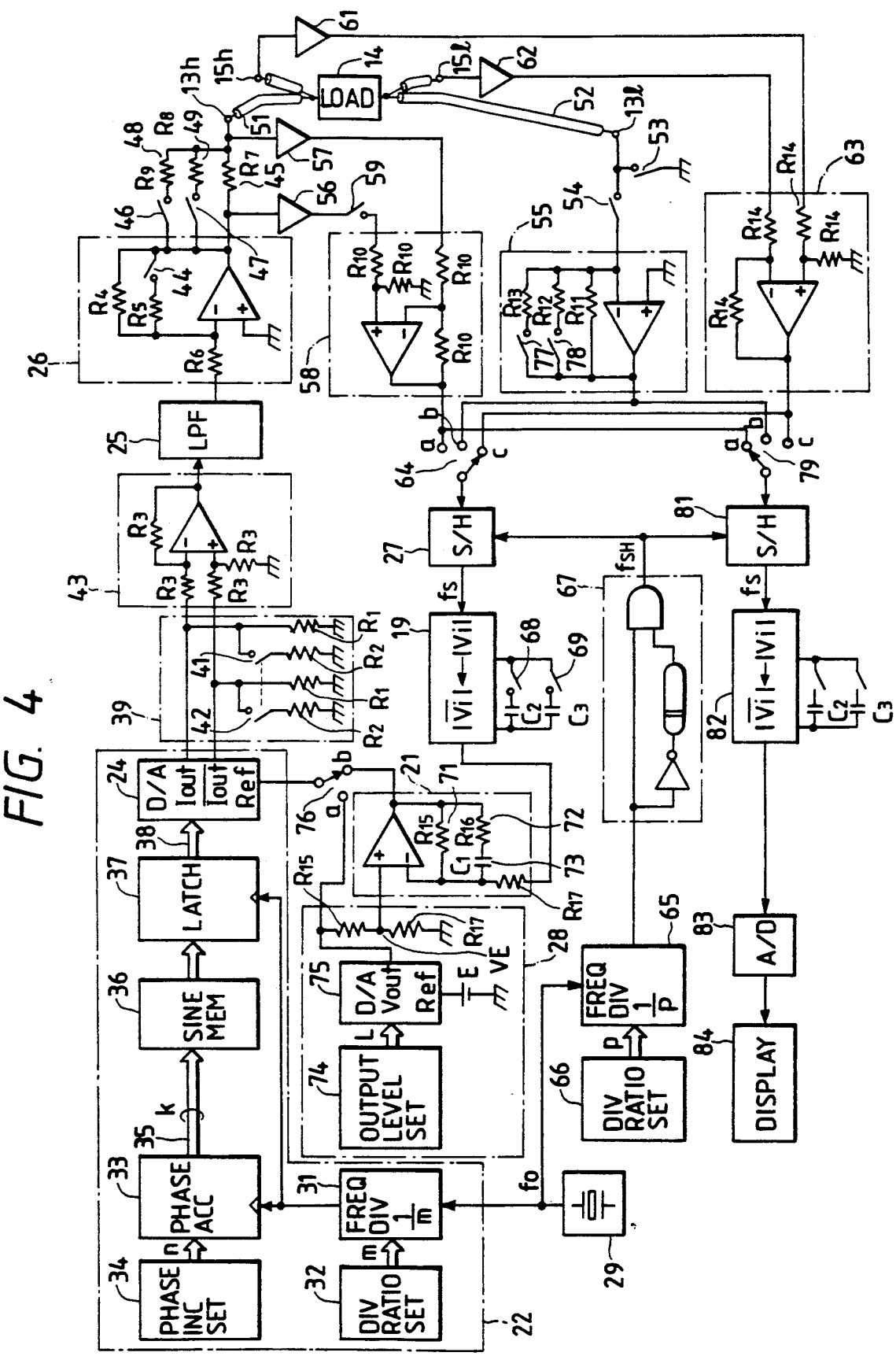
FIG. 4 is a block diagram showing its concrete or specific arrangement in detail.
Figure 5A:
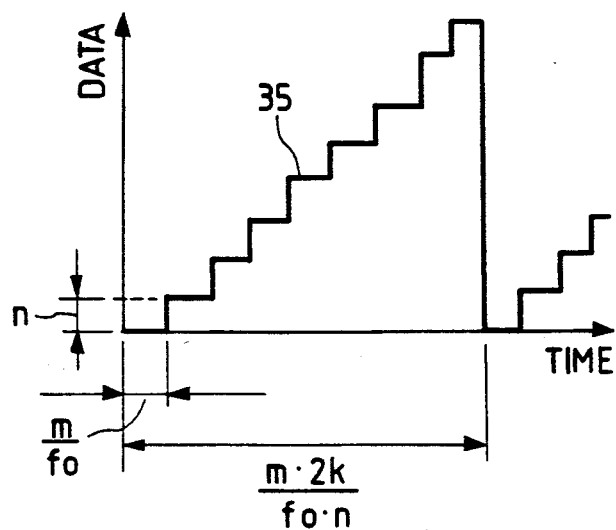
FIG. 5A is a graph showing variations of sine wave memory read address data.
Figure 5B:
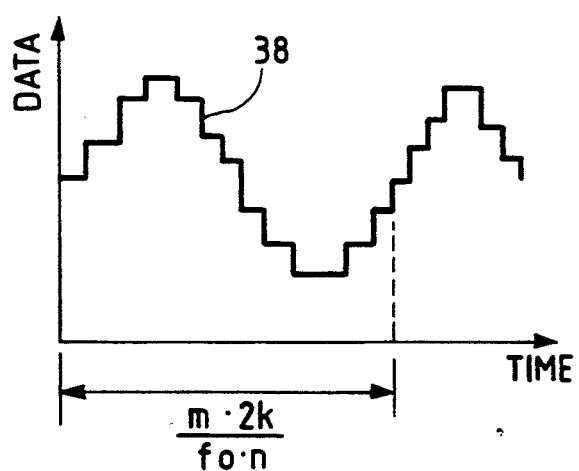
FIG. 5B is a graph showing variations of sine wave data read out of a sine wave memory.

Turning now to FIG. 4, a more specific operative example of the invention will be described. In the digital direct synthesizer 22 a clock signal of a frequency $f_O$ generated by a reference oscillator 29 is frequency divided by a frequency divider 31 down to 1/m set by a frequency dividing ratio setting register 32 and is then provided as a clock to a phase accumulator 33. Upon each application thereto of the clock the phase accumulator 33 accumulates a value n set by a phase increment setting register 34 and outputs the accumulated result as k-bit data 35 shown in FIG. 5A. The data 35 is applied as an address to a sine wave memory 36 to read out therefrom the amplitude value of the sine waveform at each sample point, and the read-output is latched in a latch 37 by the output clock of the frequency divider 31. Such a digital sine wave signal 38 as depicted in FIG. 5B can be obtained from the latch 37. The period of the digital sine wave signal 38 is $m \cdot 2^k/(f_O \cdot n)$, and this value is dependent on the set value m of the frequency dividing ratio setting register 32 and the set value n of the phase increment setting register 34. The digital sine wave signal 38 is converted by the D/A converter 24 to an analog sine wave signal.

The D/A converter is of the current output type and outputs currents $I_{out} = A(1 + \sin\omega t)/2$ and $\overline{I_{out}} = A(1 - \sin\omega t)/2$ from its two terminals. The two sine wave currents are applied to a current-voltage converter 39, wherein they are each converted to a sine wave voltage. In this instance, when the sine wave currents are large in amplitude, switches 41 and 42 are turned OFF to increase conversion resistance values, and when the currents are small in amplitude, the switches 41 and 42 are turned ON to decrease the conversion resistance values. The sine wave voltages thus converted are subtracted one from the other in a DC eliminator 43 to eliminate the DC component, with the result that the amplitude of the AC component is doubled, obtaining a sine wave $A \sin\omega t$. The sine wave signal composed solely of the AC component is applied via the low-pass filter 25 to the amplifier 26. The amplifier 26 is a variable-gain amplifier, in which when the difference between the output voltage at an output terminal 13h of the amplifier 26 (i.e. a high-current input terminal 13h of the four-terminal load 14) and the load voltage at a high-voltage input terminal 15h of the load 14 is large, a switch 44 is turned OFF to increase the gain, and when the above-mentioned difference is small, the switch 44 is turned ON to decrease the gain.

The output of the amplifier 26 is connected via a resistor 45 to the output terminal 13h and is selectively connected to resistors 48 and 49 via switches 46 and 47, respectively, in parallel relation to the resistor 45, and the switches 46 and 47 are turned ON and OFF for switching the output impedance which is used in a constant impedance mode and for switching the current detecting resistance value at the output terminal 13h during a constant-current mode of operation. The high-voltage input terminal 13h is connected via a cable 51 to one end of the load 14, the other end of which is connected via a cable 52 to a low-current output terminal 13l. The low-current output terminal 13l can be grounded via a switch 53 and is connected via a switch 54 to a current-voltage converter 55.

The resistor 45 is connected at both ends to a differential amplifier 58 via high input impedance buffers 56 and 57, and a switch 59 is connected between the buffer 56 connected to the amplifier 26 and the differential amplifier 58. The terminals 15h and 15l at both ends of the load 14 are connected to a differential amplifier 63 via high input impedance buffers 61 and 62, respectively. A desired one of the output a of the differential amplifier 58, the output b of the current-voltage converter 55 and the output c of the differential amplifier 63 can be selectively connected via a change-over switch 64 to the sample-and-hold circuit 27 which operates as a frequency converter.

The output clock signal of the reference oscillator 29 is frequency divided by a frequency divider 65 down to 1/p in accordance with a set value p of a frequency dividing ratio setting register 66. The frequency-divided output is subjected to building-up differentiation by a sample pulse generator 67 to create a sample pulse of a frequency $f_{SH} = f_O/p$, which is applied to the sample-and-hold circuit 27 to sample and hold therein the input signal thereto. The output of the sample-and-hold circuit 27 is applied to the known output detector 19, wherein its absolute value $|Vi|$ is obtained by a rectifier and then its mean value $|\overline{Vi}|$ is obtained by a smoothing circuit. The time constant of the smoothing circuit for obtaining the mean value is set, by ON-OFF control of switches 68 and 69, to, for example, 1, 0.1 and about 0.01 second when the frequency $f_S$ of the input signal to the output detector 19 is 10, 100 and above 1 kHz, respectively.

The output of the output detector 19 is compared with the reference voltage $V_E$ of the reference source 28 in the comparator 21. The comparator 21 has connected thereto resistors 71 and 72 and a capacitor 73 for making an open-loop phase compensation so as to prevent oscillation. In the reference source 28 a value L set by an output level setting register 74 is converted by a D/A converter 75 to an analog voltage, which is divided and is then provided as the reference voltage $V_E$ to the comparator 21. The outputs of the comparator 21 and the D/A converter 24 are selectively provided via a switch 76 to a reference voltage terminal of the D/A converter 24. In the case where the AC signal generating apparatus of the present invention is used in a constant impedance output mode, the switch 76 is connected to the output side of the D/A converter 75, and when the apparatus is used in a constant-voltage or constant-current mode, the switch 76 is connected to the output side of the comparator 21.

When the output terminal 13h is to be held constant-voltage, the switch 53 is turned ON, the switches 54 and 59 are turned OFF, the change-over switch 64 is connected to the side a, and the switch 76 is connected to the comparator 21. In this instance, the output voltage at the output terminal 13h is provided from the differential amplifier 58 and is applied via the change-over switch 64 to the sample-and-hold circuit 27, by which is obtained at the output terminal 13h a voltage which makes the output of the output detector 19 equal to the reference voltage $V_E$. Where the output current at the output terminal 13h (i.e. the sum of a load current and a leakage current of the cable 51) is to be made constant-current, the switch 59 is turned ON in the above-mentioned case. By this, the voltage across the resistor 45, i.e. the voltage corresponding to the current flowing through the output terminal 13h, is obtained at the output of the differential amplifier 58, and this voltage is supplied to the sample-and-hold circuit 27, by which the output current at the output terminal 13h is held at a constant value.

Where the load current is to be made constant, the switch 53 is turned OFF, the switch 54 is turned ON, the change-over switch 64 is connected to the side b and the switch 76 is connected to the comparator 21. In this instance, the input end of the current-voltage converter 55 is virtually grounded, the current having flowed through the load 14 is supplied to the virtually grounded input end of the converter 55, and the load current is converted to a voltage, which is applied to the sample-and-hold circuit 27, whereby the load current is held at a constant value. The conversion gain of the current-voltage converter 55 can be varied by switches 77 and 78. Where the voltage across the load 14 (i.e. a voltage which is not affected by the cable) is to be held constant, the change-over switch 64 is connected to the side c and the switch 76 is connected to the comparator 21. In this case, the voltage across the load is obtained from the differential amplifier 63 and is provided to the sample-and-hold circuit 27, whereby the voltage across the load 14 is held constant.

A change-over switch 79 is used to selectively connect the output a of the differential amplifier 58, the output b of the current-voltage converter 55 and the output c of the differential amplifier 63 to a sample-and-hold circuit 81. In the sample-and-hold circuit 81 the input thereto is sampled and held by the sample pulse from the sample pulse generator 67 and is then converted to a low-frequency signal. The output of the sample-and-hold circuit 81 is supplied to an output detector 82 which is exactly identical in construction with the output detector 19. The output of the output detector 82 is converted by an A/D converter 83 to a digital value, which is supplied to a display 84. By setting of the various switches the voltage or current at the output terminal 13h, the load current and the load voltage can be displayed on the display 84.

Next, a description will be given of the frequency converting operation in the sample-and-hold circuits 27 and 81. The frequency $f_{OSC}$ of the AC signal which is supplied to the load 14 is $f_O \cdot n/m \cdot 2^k$ (Hz) as mentioned previously, and the desired frequency $f_{OSC}$ is obtained by holding k and $f_O$ unchanged and adjusting m and n (both of which are integers). The sampling frequency $f_{SH}$ is $f_O/p$ (Hz), and the desired sampling frequency $f_{SH}$ is obtained by holding $f_O$ unchanged and adjusting p (an integer). This adjustment is made to prevent the frequency $f_{OSC}$ from becoming equal to an integral multiple of the Nyquist frequency (i.e. $f_{SH}/2$). The frequency $f_S$ of the signal which is frequency converted by and output from each of the sample-and-hold circuits 27 and 81 is determined by either one of the following two cases:

$$f_S = f_{OSC} - N \cdot f_{SH} \text{ for } N \cdot f_{SH} \leq f_{OSC} < (N + \tfrac{1}{2}) \cdot f_{SH} \quad (A)$$

$$f_S = (N+1) \cdot f_{SH} - f_{OSC} \text{ for }$$
$$(N+\tfrac{1}{2}) \cdot f_{SH} < f_{OSC} \leq (N+1) \cdot f_{SH} \quad (B)$$

In the above N is an integer greater than zero.

As a result of this, the frequency $f_S$ is converted to $O \leq F_S < F_{SH}/2$ and the amplitude is the same as that of the input. For instance, where $f_O = 102.4$ MHz, m = 1 and k = 16, the sampling frequency becomes $f_{SH} = 102.4$ kHz for p = 1000 (fixed), and the frequency $f_{OSC}$ is converted, in accordance with the set value of the integer n, to the frequency $f_S$ as shown in the following table I:

TABLE I

| n | $f_{OSC}$ | N | CASE | $f_S$ |
|---|-----------|---|------|-------|
| 6400 | 10 MHz | 97 | (B) | 35.2 kHz |
| 640 | 1 MHz | 9 | (B) | 24 kHz |
| 64 | 100 kHz | 0 | (B) | 2.4 kHz |
| 10 | 15.625 kHz | 0 | (A) | 15.625 kHz |

It is preferable to change the sampling frequency $f_{SH}$ in accordance with frequency $f_{OSC}$ so that the converted frequency $f_S$ may become substantially equal to an operating frequency which increases the detecting accuracy and the response speed of the output detector 19.

Figure 6:
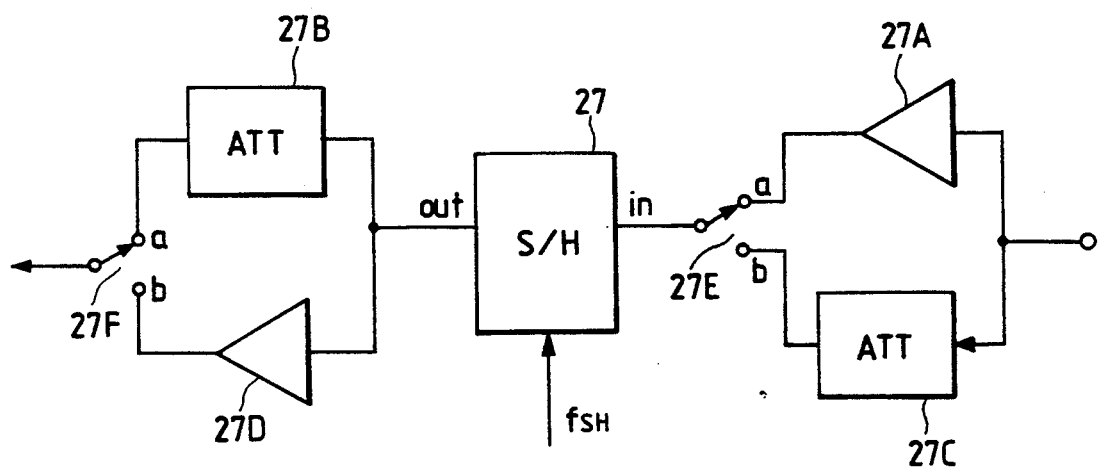
FIG. 6 is a bock diagram showing an example of an arrangement for frequency converting an input signal of a wide dynamic range by a sample-and-hold circuit of a narrow dynamic range.

In the case where the dynamic range of the sample-and-hold circuit 27 is narrow, such an arrangement as shown in FIG. 6 may also be employed. For a small-amplitude input, switches 27E and 27F are each connected to a terminal a, the input is amplified K dB by an amplifier 27A and is then applied to the sample-and-hold circuit 27, the output of which is attenuated K dB by an attenuator 27B and is then applied to the output detector 19. For a large-amplitude input, the switches 27E and 27F are each connected to a terminal b, the input is attenuated R dB by an attenuator 27C and is then applied to the sample-and-hold circuit 27, the output of which is amplified R dB by an amplifier 27D and is then supplied the output detector 19.

While in the above the absolute value of the input is obtained first and then its mean value is obtained in the output detector 19, it is also possible to employ an arrangement in which the input is squared, the output is averaged and the square root of the output is extracted to detect the effective value, or an arrangement in which the input is applied via an absolute value circuit or directly to a peak value circuit to detect the maximum value of the input.

As described above, the present invention employs the digital direct synthesizer and converts the digital sine wave signal to analog form by the D/A converter, so that distortion is low; the distortion is only about −50 dBc when the D/A converter 24 is 8-bit, and it is as low as about −80 dBc when the converter is 13-bit. Furthermore, since the digital direct synthesizer is used, the frequency settling time is as short as 1 μsec or so. In the case where the input is supplied to the output detector 19 after conversion to a low frequency (below 100 kHz), high accuracy (0.1 to 1%) can be obtained over a wide frequency range (10 Hz to 40 MHz). Moreover, the use of the digital direct synthesizer, that is, the use of the phase accumulator 33 and the sine wave memory 36, provides a high frequency resolving power.

It will be apparent that many modifications and variations may be effected without departing from the scope of the novel concepts of the present invention.

What is claimed is:

1. An AC signal generating apparatus comprising:
   a digital direct synthesizer comprising:
   a digital sine wave generating part for generating a digital sine wave signal of a set frequency; and
   D/A converting means for converting the digital sine wave signal to an analog sine wave signal based on a reference voltage applied to said D/A converting means;
   frequency converting means connected to said digital direct synthesizer for converting the analog sine wave signal to a lower frequency sine wave signal, said frequency converting means including sample pulse generating means for generating sampling pulses and sample-and-hold means for, upon each application thereto of the sampling pulses, sampling and holding the analog sine wave signal from said digital direct synthesizer;

output detecting means for detecting the magnitude of the lower frequency sine wave signal from said frequency converting means; and comparing means for comparing the detected output of said output detecting means with a reference value, the difference therebetween being negatively fed back, as the reference voltage, to said D/A converting means to control a conversion gain of the D/A converting means so that the difference approaches zero.

2. The AC signal generating apparatus according to claim 1, wherein said sample pulse generating means includes means for changing the frequency of generation of said sample pulses.

3. The AC signal generating apparatus according to claim 1, wherein said frequency converting means comprises:

first gain select means, comprising first amplifying means, connected to said digital direct synthesizer, for amplifying the analog sine wave signal;

first attenuating means, connected to said digital direct synthesizer, for attenuating the analog sine wave signal; and first switch means for selectively connecting outputs of said first amplifying means and said first attenuating means to said sample-and-hold means; and second gain select means comprising second amplifying means, connected to said sample-and-hold means, for amplifying an output of said sample-and-hold means;

second attenuating means, connected to said sample-and-hold means, for attenuating the output of said sample-and-hold means; and second switch means for selectively connecting outputs of said second amplifying means and said second attenuating means to an input of said output detector means.

4. The AC signal generating apparatus according to claim 3, wherein said first amplifying means and said second attenuating means have gains selected to cancel each other and wherein said first attenuating means and said second amplifying means have gains selected to cancel each other.

* * * * *

UNITED STATES PATENT AND TRADEMARK OFFICE
CERTIFICATE OF CORRECTION

PATENT NO. : 5,146,224
DATED : September 8, 1992
INVENTOR(S) : Kitayoshi

It is certified that error appears in the above-identified patent and that said Letters Patent is hereby corrected as shown below:

Column 2, line 49, after "which"

insert --is applied to--;

Column 3, line 1, change "Of" to --of--; and

Column 4, line 34, change "Con-" to --con---.

Signed and Sealed this

Fifth Day of October, 1993

Attest:

BRUCE LEHMAN

Attesting Officer

Commissioner of Patents and Trademarks